United States Patent [19]

Odom

[11] 4,286,206

[45] Aug. 25, 1981

[54] LOAD-RESPONSIVE TREATER CONTROLLER

[75] Inventor: Roger K. Odom, Redwood City, Calif.

[73] Assignee: Combustion Engineering, Inc., Windsor, Conn.

[21] Appl. No.: 82,442

[22] Filed: Oct. 9, 1979

[51] Int. Cl.³ .............................................. G05F 1/45
[52] U.S. Cl. ..................................... 323/244; 323/901
[58] Field of Search ................... 323/18, 22 SC, 24, 4, 323/9; 307/252 B, 252 T, 252 UA

[56] References Cited

U.S. PATENT DOCUMENTS

| | | | |
|---|---|---|---|
| 3,535,614 | 10/1970 | Wilson | 323/22 SC |
| 3,939,395 | 2/1976 | Prestridge et al. | 323/4 |
| 4,050,008 | 9/1977 | Glaser et al. | 323/18 X |
| 4,122,382 | 10/1978 | Bernstein | 323/4 |

Primary Examiner—A. D. Pellinen
Attorney, Agent, or Firm—Arthur L. Wade

[57] ABSTRACT

The essential elements of the electrical system of a treater, or dehydrator, of produced oil well fluids are connected and physically oriented as mounted within the shell of the treater. The electrodes (1 and 2) of the treater are energized from a line supply, or mains, through a transformer (10), to establish an electrostatic field. The transformer introduces an inductive component to the load. A control circuit (40) is arranged to respond to the current demanded by this inductive load and disconnect the load from the line supply, or mains, in a predetermined program designed to protect the components of the system, yet reconnect the load to the supply as frequently as practical.

10 Claims, 3 Drawing Figures

LOAD-RESPONSIVE TREATER CONTROLLER

TECHNICAL FIELD

The present invention relates to the interruption of an electrostatic field for fluid dehydration at a predetermined current and reestablishment of the field in a sequence and at the times which will balance the residual flux of a transformer in the field generator. The system generating the electrostatic field acts as a load for the transformer and has an inductive component due to the transformer. More particularly, the invention relates to reconnection of a disconnected line supply to the inductive load of an electrostatic field generator in that lag from the zero voltage crossing of the supply voltage which will balance the residual flux of the inductive load to obviate transient development which will be detrimental to the system components.

BACKGROUND ART

The present invention is in the field of regulating the average power applied to varying loads; particularly, this invention is applicable to oil field treater equipment.

An example of the type of equipment in which the present invention finds its primary, though not exclusive, application is Prestridge-Wallace U.S. Pat. No. 3,772,180. The Prestridge-Wallace apparatus is an oil treater that reduces the amount of water contained in oil. It applies an a.c. voltage across an interface in the vicinity of an oil-water emulsion. The amount of power drawn by this load can swing to rather high levels when the moisture content of the emulsion is high. If the average power applied to the load remains high, damage can be done to the treater equipment. Accordingly, it is necessary to regulate the power applied to the load.

Another patent issued to Prestridge-Wallace, U.S. Pat. No. 3,939,395, discloses a circuit for regulating the average power applied to the load. Basically, the apparatus in the U.S. Pat. No. 3,939,395 senses the a.c. current flowing through the load, rectifies and filters the representation produced by the sensing, and uses the result as an indication of whether or not to remove the power from the load. As long as this resultant filtered current overload signal remains above a predetermined level, the power remains removed from the load. When the filtered signal falls below the predetermined level, the apparatus reconnects the a.c. source at a predetermined relationship to the zero crossing of the voltage with the objective of avoiding high voltage transients in the transformer. Because the filtered signal is at a high value immediately after a large current has flowed through the load, the power is disconnected for some period of time until the voltage in the filter circuit has decayed below the predetermined level. If the current is relatively high, it takes a relatively long time for the voltage in the filter circuit to decay, thereby decreasing the duty cycle of the application of power to the load. If the current level is not quite so high, the duty cycle will be higher. If the current is low enough to allow continuous application of the source voltage without exceeding the average power, the voltage in the filter circuit will not be high enough to cause the power to be disconnected from the load, and the duty cycle is 100 percent. Thus, the average power level remains below that which will damage the treater apparatus.

While the apparatus of U.S. Pat. Nos. Prestridge-Wallace 3,939,395 and Bernstein 4,122,382 does act to protect the treater to some extent, it is now apparent that their systems contain certain deficiencies which require modification.

Neither the Prestridge-Wallace nor the Bernstein system accounted for the flux relationships in their transformers as their control systems connected and disconnected their line supplies to their transformers. Both systems concentrated on connecting and disconnecting as the a.c. line supply voltage goes through zero. Although these operations were in the right direction to avoid the threatening transients, the rationale of their systems did not properly account for the variations of residual flux in their transformers. The fact is that a control system cannot be made to operate the electronic switch in the line supply as if it were a resistive element whose characteristics are unrelated to the inductive characteristics of the load. If zero voltage switching is the function of the controller, reconnection of the voltage to the transformer will not occur at the proper time to match the residual flux of the transformer.

It is now clear that the a.c. voltage supply to inductive load must be reconnected in a lag relationship to the zero voltage crossing of the supply to insure that the flux demand is substantially equal to the residual flux remaining in the core of the transformer from the previous disconnection.

Disclosure of Invention

The present invention contemplates sensing the a.c. voltage supply which is connected to and disconnected from a transformer which is, in turn, connected to electrodes between which an electrostatic field is established. The invention contemplates the use of a solid state switch by which the circuit makes and brakes the connection between the supply and transformer. The invention specifically contemplates means for adjustment of the lag between the zero crossing of the supply voltage and reconnection by means of the solid state switch. This lag results in a balancing of that residual flux which remained following the preceding disconnection by the solid state switch.

The invention further contemplates a control circuit responsive to the a.c. voltage of the line supply connected and disconnected to the transformer supplying voltage to electrodes between which an electrostatic field is generated. Signal pulses are generated by the control circuit from the voltage of the line supply and are applied in the proper sequence to silicon controlled rectifiers (SCR's) as the solid state switch. Each signal pulse controls the pulse output of a generator. The output of the pulse generator is a chain of pulses for each signal pulse controlling the generator. The first of the chain pulses is a full width pulse. Each chain of pulses is applied to the SCR's to bring about connection of the line supply to the transformer for a full half cycle of the line supply. Each signal pulse initiates its pulse chain from the generator with a predetermined lag time from a zero crossing of the line supply voltage which will create a demand for flux in the transformer core to substantially balance whatever residual flux mentioned in the transformer core from the preceding disconnection of the line supply from the transformer.

The invention further contemplates provision of a circuit through which the line current is sensed which will respond to an extreme overload value of the current by greatly limiting the power consumption by the inductive load during the interval of overload.

The invention further contemplates provision of a circuit to maintain an overload current signal on the circuit at the initial start-up of the circuit.

Other objects, advantages and features of the invention will become apparent to one skilled in the art upon consideration of the written specification, appended claims, and accompanying drawings.

BRIEF DESCRIPTION OF DRAWINGS

FIG. 3 is a detailed schematic drawing of the circuits within the blocks of FIG. 2.

BEST MODE FOR CARRYING OUT THE INVENTION

General Organization of the Disclosure

Figure 1:
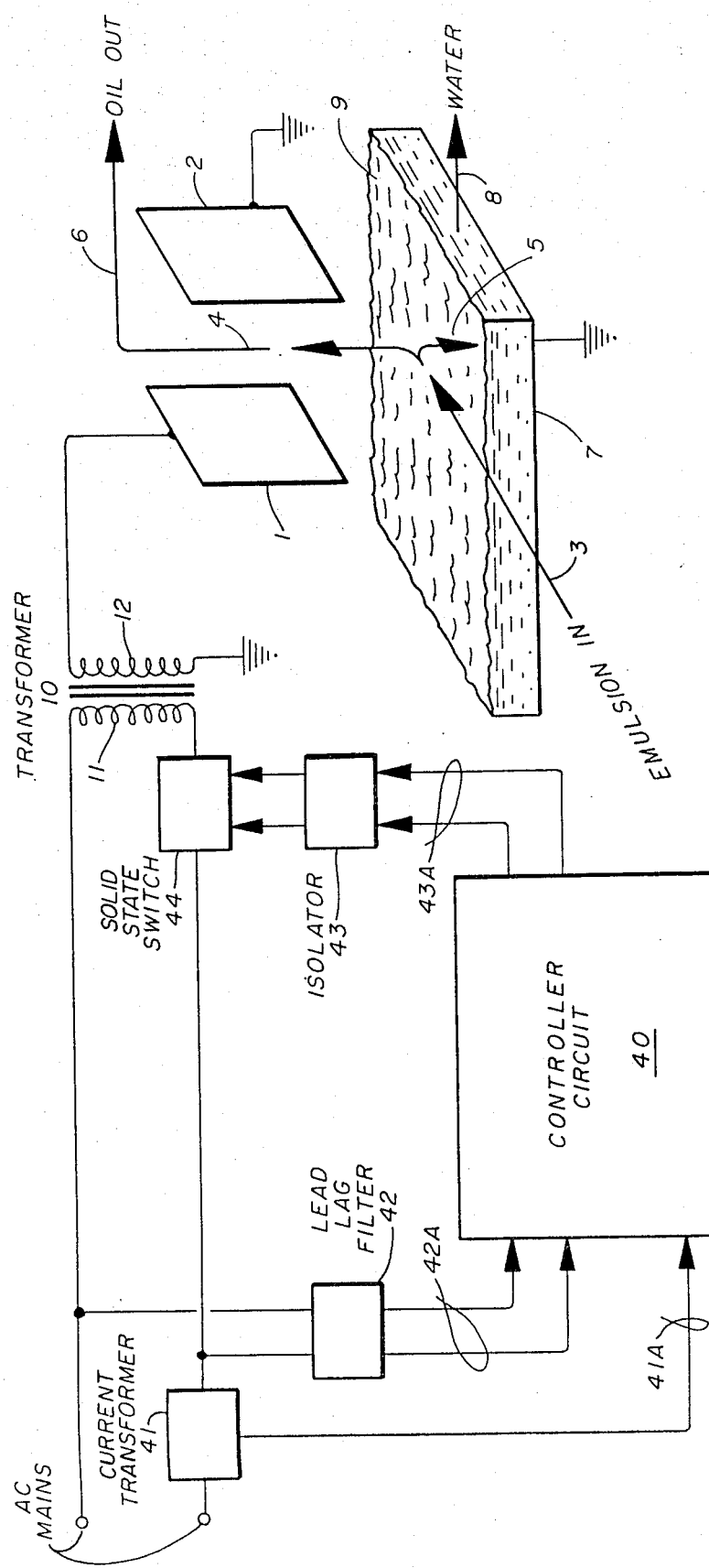
FIG. 1 is a schematic drawing of a circuit embodying the invention as connected to an electrode system generating an electrostatic field applied to dehydrate an oil field emulsion.

In presenting FIG. 1 of the present disclosure, illustration of conventional components of the electric treater have not been made because their form and function can be readily understood from the disclosure of the patents supra. It is even believed, in this particular situation, that the details would tend to hamper a good perspective of the invention.

FIG. 1, therefore, has been developed by a somewhat diagrammatic representation of structure with which an embodiment of the invention is associated.

Electrodes 1 and 2 are shown, arranged vertically and parallel to each other and to the flow of fluids, as within the treater shell. The emulsion of the well stream is directed toward the electrodes along path 3 which is generally lower than the electrodes. The flow of the emulsion from path 3 is then directed upward along path 4. Any water droplets that coalesce to a size large enough to gravitate from the emulsion travel downward along path 5. After this treatment by exposure to the electrostatic field generated by the invention, the oil of the emulsion continues upward along path 6 for delivery as the finished product of the process.

The water which is separated from the emulsion flowing along path 5 collects in a lower body 7. A controlled discharge of water from this body 7 is indicated as along path 8. The control of discharge water is exerted to maintain its upper surface 9 a predetermined distance below the electrodes.

With the relative spatial relationship between the electrodes and the upper water surface now established, it can be generally appreciated that the electrostatic field functions to provide the coalescing force on the water droplets.

Transformer 10 is presently the more practical form for a basic source of potential. Primary winding 11 of transformer 10 is energized by an a.c. voltage and a first end of secondary winding 12 is connected to electrode 1. Electrode 2 and the second end of secondary winding 12 are connected to ground.

In FIG. 1, transformer 10 may be regarded as either the immediate source of a.c. voltage for the load or, more generally, the means with which the line supply is connected to the load. The disclosure has not, thus far, contemplated the emulsion becoming conductive to the degree that sufficient current will flow in the circuit to threaten failure or breakdown of the components. Obviously, this is one of the conditions which is a threat and must be prevented by control of the electrical power supplied to transformer 10.

In FIG. 1, controller 40 provides control signals for controlling the connection of primary winding 11 to the a.c. means. Further, current transformer 41 represents a current sensing device in association with the circuit of primary 11 to produce a signal proportional to current flowing in the load. As a first function of the controller 40, the present invention disconnects transformer 10, at solid state switch 44, from the line supply, or mains, after the current in the load exceeds a first predetermined value. Continuous connection is maintained only so long as the current in the load remains within a predetermined range.

It is an object of the present invention to disconnect the transformer from its line supply at solid state switch 44 for an interval of time proportional to the magnitude by which the load current exceeds a predetermined value. A section of the circuit of controller 40 is also arranged to automatically reconnect, by solid state switch 44, the transformer to the line supply at the end of the interval of time. If the overload current still exists, disconnection is again made by the controller circuit for a time proportional to the magnitude of the overload current at that time. This connection and disconnection sequence repeats until the conductivity of the path between the electrodes 1 and 2 reduces, or conversely, the impedance increases to within the range which will not destroy the system components. The invention is embodied in the control circuit to establish the reconnection with the solid state switch 44 at the time relative to the zero voltage crossing of the line supply which will not require a substantial change from the residue of flux remaining from the preceding time of disconnection.

Figure 2:
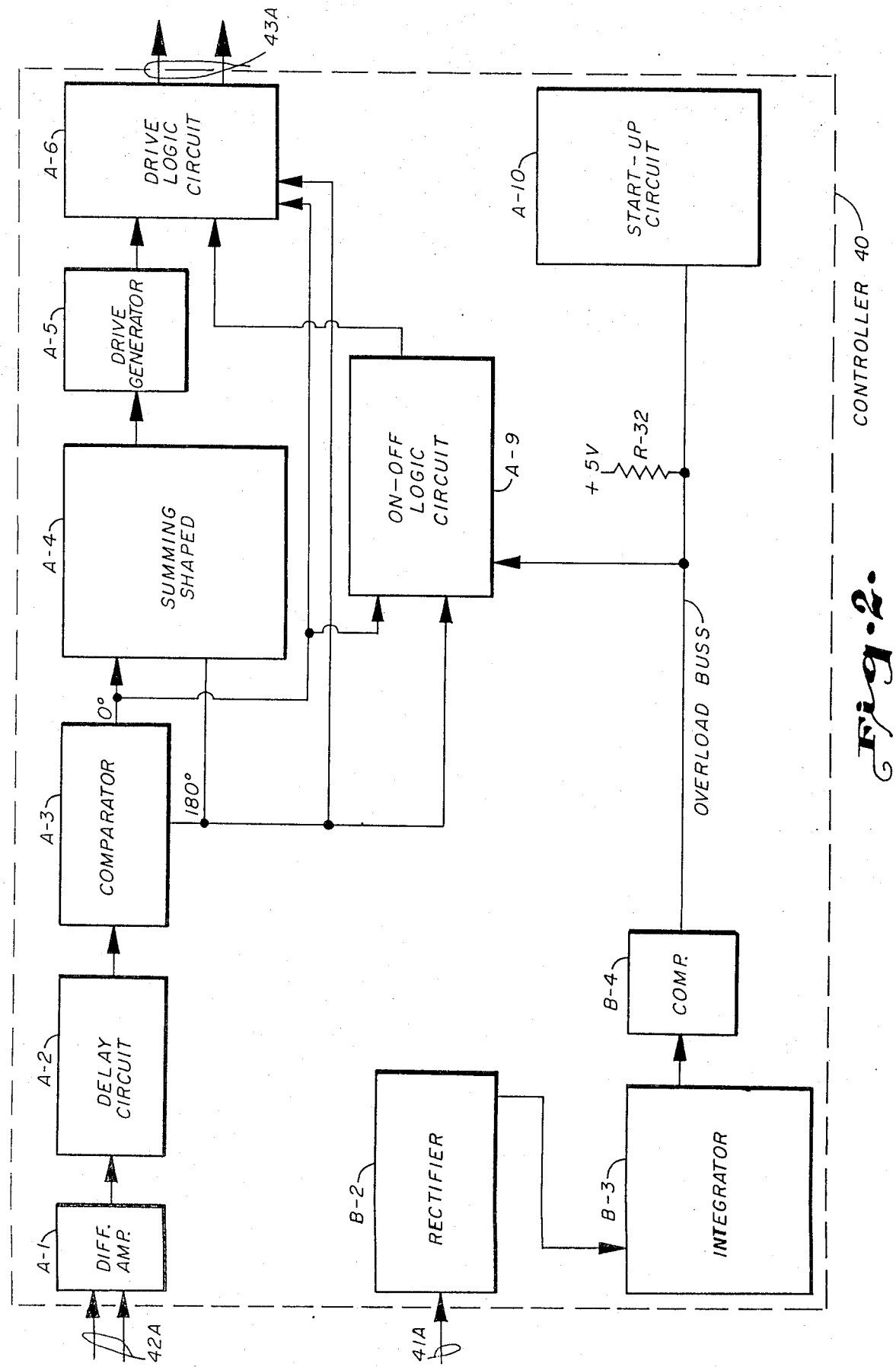
FIG. 2 is a block diagram of the controller of FIG. 1.
Figure 5:
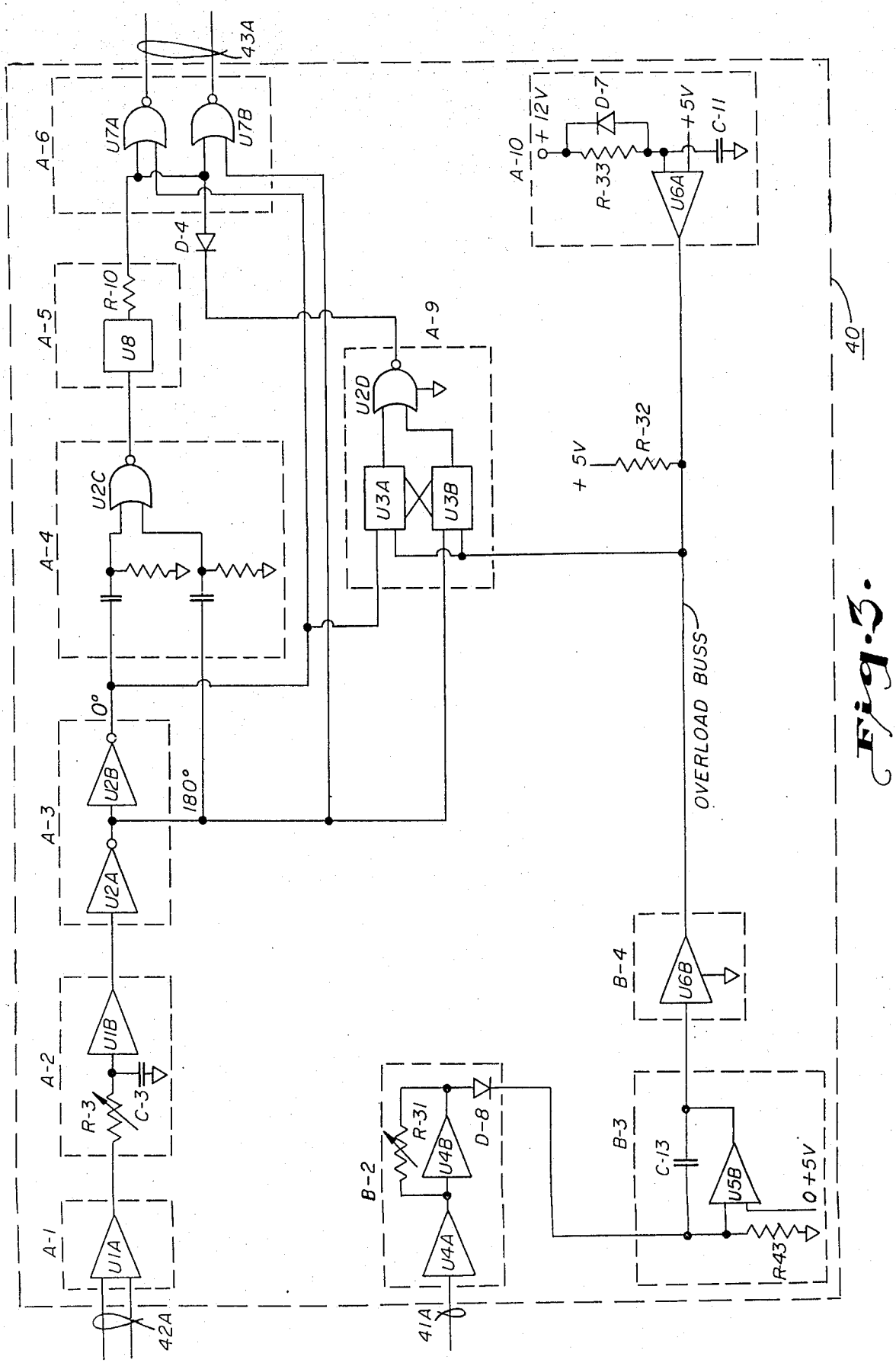

The Controller Block Diagram of FIG. 2

A functional block diagram of controller circuit 40 is specifically disclosed in FIG. 2. As shown in FIG. 1, the primary winding of high voltage transformer 10 is connected in series with the solid state switch 44. A lead/lag filter 42 is connected in parallel with the series-connected switch and primary winding.

A pause in the description is made to emphasize that the a.c. mains may be either single-phase or two lines of a three-phase source of proper voltage and KVA rating. The lead/lag filter 42 is comprised of a balanced, high impedance series network providing a high degree of isolation from the mains for safety followed by a balanced, low impedance parallel network for first-order filtering.

To properly coordinate the disclosure of controller 40 in FIGS. 1 and 2, connections 42A are shown between lead/lag filter 42 and controller 40. Also, current sensing transformer 41 is connected to controller 40 by electrical connection 41A. Finally, an isolator 43 is connected to controller 40 with leads 43A, the output signals from controller 40 being delivered to switch 44 via isolator 43.

Differential amplifier A1, within controller 40, is connected to lead/lag filter 42 to generate a square-wave, which will have a circuit-ground-reference, whose pulse transitions coincide with the zero voltage crossings of the a.c. mains. The circuit of A2 then receives this squarewave from A1. It is the circuit of A2 that the present invention provides adjustable means by which this square wave is delayed to generate a timing signal relative to the zero crossing of the line supply, to establish the necessary predetermined timing for reconnection of the line supply to the load.

The delayed timing signals from A2 are applied to a comparator A3 to develop two reference timing signal pulse outputs, one at 0° and one at 180° with respect to the supply voltage. These two reference signals are then received by summing circuit A4 which sums and shapes the pulses from comparator A3 to form output pulses which start drive generator A5. These pulses from A4 are produced at a time which lags each mains zero voltage crossing by a period established by A2. Each of these pulses will start the drive generator A5 at a given time.

Generator or oscillator A5 is not a free running oscillator. It is a source of pulses which is started and stopped by the reference signals from A4. Started and stopped by these reference signals from A4, generator-oscillator A5 initiates each series of pulses with a full width pulse. The result is a chain, or train, of multiple pulses from generator A5, each of which was initiated by a pulse from A4. The final result is that a train of multiple pulses is produced at each zero crossing as delayed by A2.

The drive logic A6, under control of the on/off logic A9, directs the train of multiple pulses from the drive generator within A5 to the appropriate half of the solid state switch 44 by way of isolator 43. The on/off logic A9 is, of course, also under the control of the reference timing signal pulses of A3. Thus, as indicated in the block arrangement of FIG. 2, the on/off logic circuit of A9 is responsive to the pulses of A3 in parallel with the control of the generator A5 output by the same signals. Broadly, the output of generator A5 to drive logic A6 is synchronized with the control of drive logic A6 by the on/off logic circuit A9.

During normal operation, each half of the solid state switch 44 receives a train of pulses from generator A5 with each appropriate delayed mains zero crossing and terminates with the next following zero current crossing 180° later.

Control of 40 by the Current of the Supply

The load current, sampled by current transformer 41, is delivered to controller 40 by lead 41A. 41A applies the current sample as an input to the precision rectifier circuit of B2. The output of B2 is proportional to the current and when this output exceeds a predetermined value, it is processed by the subsequent circuit components to ultimately disconnect the source from the inductive load at the solid state switch 44. The precision rectifier signal output of B2 is delivered via integrator B3 as the input of comparator B4. If the load current exceeds a predetermined maximum, the excess current or overload current is integrated by the integration circuit of B3 which produces an overload signal output whose time duration is proportional to both the magnitude and duration of the overload current established by B2. This signal is applied to on/off logic A9 through comparator B4, the set point value being established in B2.

When the output of B4 returns to the set point, the on/off logic, A9 again initiates the turn-on sequence required; hence, the total overload cycle consists of opening the solid state switch 44 for one or more half-cycles as required to limit the average load current.

Problems of Reconnecting an Inductive Load

It must be noted that the solid state switch is allowed to reconnect following each mains zero voltage crossing at the appropriate time. With an inductive load, the reconnection must be delayed for a time period commensurate with the load conditions. That is, the load current will normally lag behind the mains voltage so the initial reconnection must be delayed accordingly in order to prevent an uncontrolled transient inrush current. This delay is provided by the invention embodied in the structure of A2. When the output of B4 returns to normal, following an overload condition, A2 develops a signal which is delivered to A3 in a proper manner to delay the logic signal so that reconnection of the mains to the transformer will take place in accordance with the invention. This procedure insures that the immediate turn-on conditions agree with prior turn-off conditions to obviate destructive or problematic current transients.

The broad reference to "conditions" in the inductive load represented by transformer 10 must be understood thoroughly to evaluate the importance of the invention. When the circuit between the mains and the transformer 10 is broken at the solid state switch 44, the current will be going through one of its half cycles. The characteristics of the solid state switch 44 insure that disconnection will not occur until the half cycle of current has been completed; i.e. the SCR's are connected in a self-commutating configuration. The main voltage will be leading the current by some discrete electrical angle. Therefore, when the mains current reaches zero and the leading voltage is leading by the discrete angle, a portion of flux existing at the time in the transformer core will continue to exist for a finite period of time. It is that part of this flux still remaining at the time of reconnection which is termed "residual" flux.

When reconnection of the mains to the transformer takes place, the residual flux, as reduced during the time of disconnection, must be matched. If the mains volatge at the time of reconnection demands flux which is additive to the residual flux of disconnection, the resulting current drawn can be highly undesirable transient which can injure all components of the system. The answer is simple in theory. The reconnection must occur at that time following zero crossing of the mains supply voltage which will balance the residual flux in existence at the time of reconnection. The basic problem is solved by balancing the magnitude and polarity of the residual flux remaining in the transformer core at the time of reconnection. Reconnection must be made in the particular phase of the mains voltage and at the precise magnitude which will balance the residual flux. At disconnection, there is substantially a 20% decay of the flux almost immediately. Other factors establishing the magnitude at the time of reconnection may have to be empirically ascertained. Whatever the delay of reconnection following zero voltage crossing, this delay is set by means of the circuit of A2.

The disclosure of the structure embodying the invention is detailed further in FIG. 3. The arrangement of the blocks of FIG. 2 has been duplicated in FIG. 3. The internal circuits of the blocks are disclosed in FIG. 3 to the extent which enables one skilled in the art to make a practical reduction to practice of the invention.

The voltage values cited are those in common use within integrated circuits (I.C.). These solid state components operate at 5 to 12 volts level in order to attain the desired speed of response for this type circuit.

The circuits which embody the present invention are conveniently designed with the newly developed integrated circuit modules. The art has provided these subminiature units which greatly reduce the labor and cost associated with the circuits disclosed in FIG. 3. Where voltage levels are indicated, it is well to keep in mind that the 5 and 12 volt levels for these circuits are desirable to give the dynamic range required of the signals processed in the circuits.

Referring again to the sampling of the mains voltage by lead/lag filter 42, this circuit is connected to A1 by leads 42A. It is at this point that the mains zero voltage crossings are ascertained by integrated circuits (I.C.) U1A operating as a precision comparator. The output of U1A is a square wave to represent each zero crossing of the voltage waveform. This square wave is delayed by way of C3 and adjustable R3 to produce delayed zero crossings of the supply voltage in accordance with the demands of an inductive load. Comparator U1B then restores the delayed waveform to a square wave, after it has been somewhat deformed by the delay circuit.

This square wave from U1B is then passed through two cascaded inverters U2A and U2B. The outputs of these inverters are the so-called 0° and 180° timing reference signals. The 0° zero crossing reference is generated at the beginning of the square wave, and the 180° zero crossing reference is generated at the end of the square wave. These signals are connected in parallel to A4, A6 and A9. These output signals are differentiated and summed (NOR'd) by summing and integrating circuit U2C in the circuit of A4 to produce a square wave of relatively short duration for each delayed zero voltage crossing.

This square wave output pulse of relatively short duration of A4 is applied to the input of pulse generator or oscillator U8. Each pulse input to generator U8 initiates a chain of pulses as the output of U8. Each chain of pulses from U8 is fed to NOR gates U7A and U7B of A6. These gates are under the control of the 0° and 180° timing reference signals of A3 as well as an inhibit command from overload gate U2D in A9. The output circuits are so constituted that a high state of U2D results in an ON command to the solid state switch 44.

Now, assuming a high state is generated at the output of U2D, a continuous train of high frequency pulses is delivered by way of R10 to U7A and U7B. But the outputs of the gates can only follow the pulse train if both their inputs are high simultaneously; hence, the result of applying the 0° or 180° timing reference signals is to produce alternating trains of pulses to the solid state switch 44, synchronized to the mains zero crossings and properly delayed in accordance with the residual flux condition of the inductive load of transformer 10.

Overload Signal Development

As generally explained in connection with FIG. 2, a signal proportional to load current is obtained from the current transformer 41 and is applied to the precision rectifier circuit B2 when it is amplified by integrated circuits U4A and U4B. Adjustable resistor R31 in the precision rectifier circuit is set to establish the normal value of current for the system. When the magnitude of current from the source exceeds the value set by R31, diode D8 conducts this excess current as an overload signal. The overload current through diode D8 is a signal whose value is proportional to the magnitude of the overload condition. This current signal is applied to the integrator circuit B3 via diode D8 and develops a voltage across resistance R43 which is proportional to the amplitude of the overload signal. This voltage across R43 is stored on capacitor C13. At the same time, this voltage is applied as an input to integrated circuit U5B. When this voltage exceeds the bias applied to the second input, the output of U5B will switch to a logic low from its normally logic high output. The output of U5B will remain low until the voltage of C13 bleeds down through R43 to a value below the bias of U5B. U5B output thus remains low for a duration which is proportional to the magnitude of the over current condition.

When the output of U5B goes low, the output of comparator U6B is switched low, from its normally high state, initiating a disconnection procedure. The overload buss of the system is connected to the output of U6B. This disconnection procedure, to be described, results in opening of the solid state switch 44 within one-half cycle of the mains frequency. This is in marked contrast to other systems which have been designed to continue conducting for at least one full cycle.

On/off logic circuit 49 includes a gated memory comprised of the circuits of U3A and U3B. U3A and U3B are connected in parallel to the overload buss, thereby receiving the output of U6B. Specifically, the signal of the overload buss is connected so it will be received by one of the inputs of U3A and one of the inputs of U3B. These logic circuits U3A and U3B are cross-connected. The second input to U3A is connected to the 0° zero crossing reference. The second input to U3B is connected to the 180° zero crossing reference. Upon the appearance of the overload signals from B4 on the buss, U3A and U3B, through their cross connections, "remeber" in the manner described above on which of the reference signals the disconnection occurs. Therefore, upon the appearance of an overload signal, calling for disconnection at the solid state switch 44, the half cycle of the supply frequency during which the disconnection takes place is "remembered" through the cross connection to insure that reconnection occurs on the opposite polarity half cycle of the supply voltage.

Overload gate U2D is connected to receive the output signals of U3A and U3B. When the overload gate U2D switches to low logic level, it provides a conductive shorting path for the pulse trains from oscillator U8. When the logic level output of the overload buss goes high, the output of the overload gate U2D returns to the normally high state. When the overload signal from the buss to the logic circuits U3A and U3B goes high, the shorting path for pulse trains from U8 is removed, permitting the pulse trains to pass through either U7A or U7B as determined by the gating references from U2A and U2B. When the output of U2D is at a high logic level, the gates of the drive logic circuit A6 will be enabled and this permits the pulse trains from U8 to pass through switch gates U7A and U7B.

When the solid state switch 44 open, the load current is terminated and D8 ceases to conduct. Since C13 is in the negative feedback path of U5B, the latter acts in such a manner as to try to keep the voltage at the negative input greater than the positive input 5 volts. With a constant voltage across resistance R43, and so a constant current drain from C13, the output of U5B rises at a very linear, or constant, rate. As the output of U5B passes the threshold, the output of U6B reverts to its normally high state.

Extreme Overload or Short Condition

A unique feature of this integrator B3 now becomes apparent. It is obvious that the output of U5B cannot be lower than the ground; therefore, the time duration of the recovery ramp from zero is finite. Meanwhile, there is nothing to prevent diode D8 from pulling the negative input of U5B higher than 5 volts and thereby increasing the charge to C13. When this occurs, as a result of a severe overload, the output of U5B is held low until the excess charge on C13 had bled off through resistance R43 and there are again 5 volts at the input of U5B. This added mode greatly increases the integrator OFF time in the presence of a severe overload (such as an art or short), with the result that net power consumption from the a.c. lines supply during severe overloads is greatly reduced until such time that normal load conditions prevail. This feature is not found in any prior system. It is estimated that standby power under severe overload conditions can be reduced as much as 90%.

Ambient Temperature Compensation

Diode D8 additionally provides the function of ambient temperature compensation. As the ambient temperature rises, less thermal rise in the load transformer is permissible and there is less power handling capability. With the ambient rise, however, the negative temperature coefficient of D8 allows the diode to pass more current. It is possible, therefore, to safely operate the load transformer well above its rated power at the lower ambient temperatures.

Start-Up Procedure

At the time power is initially applied to the system, or after a complete power failure, upon reconnection of the power, the circuit of A10 will hold U6B output low in simulation of an overload condition. The output of U6A is held low for a period of time established by the value of C11 and R33 in the A10 circuit. It is during this time that operation of the circuit, in general, is placed into its normal mode before the signal is applied through the output of U6B to control the firing of the solid state switch 44.

When a.c. power is first applied, C11 is discharged and begins to charge by way of R33 to the 12 volts buss. Since the 5 volts buss is applied to comparator U6A much sooner than C11 can charge to 5 volts and more, the output of U6A is held at ground, thus inhibiting start-up for sufficient time for all circuit capacitances to reach stable conditions. This sequence repeats any time there has been an interruption of the mains supply.

At the time of main supply interruption, diode D7 discharges C11 much faster than the 5 volts supply can decay, thereby forcing an orderly shutdown prior to failure of the logic.

Following initial power-up and before timer U6A has released its hold on the overload buss, one of the overload logic circuits U3A or U3B in on/off logic circuit A9 will be the first to see a leading edge on one of the reference timing signal pulses from A3. This first logic signal will cause the output of overload gate U2D to go low, which by way of diode D4 will clamp or short the pulse train from U8 to U7A and U7B, thereby inhibiting drive to the solid state switch 44. At the same time, with cross connections disclosed between U3A and U3B, the other section of U3 is held in SET mode with its Q-output low. In this mode, U3 cannot respond to timing reference pulses.

Let us assume that U3A was the first to see a timing reference signal following power-up. Then U3A will be holding U2D low and holding U3B SET. At the end of timer U6A's cycle, the overload buss is pulled to 5 volts by R32. Since U3B is now inhibited, the solid state switch cannot receive drive until the first positive rising edge of the 0° timing reference pulse reaches U3A, clocks the data buss high through the Q-output and hence a low on the Q-not output, releasing the clamp of U2D. Note that since U3B was SET by U3A, its Q-output was already high so the following 180° clock will have no effect on U3B.

When the overload buss is pulled to ground, either by load current by way of U6B or mains supply failure by way of U6A, the section of U3 which first "sees a reference signal pulse" will respond by terminating drive to the solid state switch and disabling the other section of U3. If we assume that the overload buss is pulled down sometime during the period or half-cycle when the 0° timing reference is high, nothing will happen until the end of that half-cycle. The next timing reference signal pulse will obviously be on the 180° timing reference signal pulse so U3B will be the first to respond and will disable U3A and terminate drive at the end of the positive or 0° phase.

After a suitable OFF time, as determined by U6B, the overload buss returns high. U3B "remembers" because of its cross-connection with U3A that the last half-cycle was at a positive or 0° phase and restores drive to the solid state switch at the beginning of the negative, or 180° phase. In this manner, no matter which polarity or phase was last, operation resumes on the opposite polarity or phase of the mains supply. Of course, mains supply failure will erase the memory.

A General Review of FIG. 3

The essential elements of the invention are disclosed in detail by FIG. 3. FIG. 3, in its detail, specifically describes how solid state switch 44 is controlled to connect and disconnect the a.c. mains to transformer 10 under the basic control of the current overload as sensed by transformer 41. A signal commensurate with current overload is applied to on/off logic circuit A9 to control the application of signals to solid state switch 44, the switching signal being derived from the mains voltage. It is critically important that reconnection through the solid state switch 44 be precisely coordinated with the zero crossing of the mains voltage. The precision of this reconnection is controlled by circuit adjustment at A2, this adjustment establishing reconnection at an interval relative to the zero crossing of the mains voltage which will be compatible with that flux which remains in the core of transformer 10 following the preceding disconnection. If the reconnection is made at the proper time, there will be no demand for flux made on the newly applied voltage which will combine with the residual flux to produce destructive transient within the transformer.

The critical time interval between the zero crossing of the mains and the reconnection varies at least with the load carried by transformer 10. However, the art at this time is developed to the point that this adjustment can be manually established at A2 to substantially provide the smooth transition between disconnection and reconnection without the generation of the unwelcome transient. In the future, it may be possible to sense several factors which determine the residual flux conditions within transformer 10. At present, these factors are compensated with the single manual adjustment of A2.

An added feature of the circuit is the incorporation of means to coordinate the application of the generated pulse trains from A5 to the oppositely polarized SCR's with which the solid state switch 44 is embodied. Heretofore, there has been no application of a pulse generator at the A5 position which will produce its train of pulses initiated by a full width pulse of the chain. It is only such train of pulses, initiated by a full width pulse, that will most efficiently render the solid state switch 44 conductive without causing internal damage to the SCR's.

Epilogue

From certain perspectives, the embodiment of the invention performs in a very simple manner. In the preferred embodiment, as indicated in FIG. 1, an a.c. supply of electrical power is connected through an electronic switch to an inductive load in the form of an electric treater of oil well emulsions. The treatment carried out on the emulsion is simple in principle. This treatment comprises the coalescence of water in the form of droplets dispersed through crude oil. The coalescence of the water droplets, more polar than oil, is caused by the force of the electrostatic field generated between two electrodes. The electrostatic field is generated when a.c. power is applied to the electrodes from a supply of that power. This load is characterized as being inductive because of a step-up transformer which receives the power of the supply on its primary side and delivers electrical power to the electrodes from its secondary side.

The operators of this system would prefer that it remain stable, i.e. the proportion of water to oil would be constant and the electrostatic field could be generated with a level of electrical energy which would bring about the desired degree of coalescence without substantial fluctuations. This hope is continually shattered by the realities of the wide variations of proportions of oil to water in actual production. In truth, the amount of water varies, varying the conductivity of the mixture between the electrodes. The result is variations of electrical power through the transformer and to the electrodes depending on the degree of conductivity of the mixture between the electrodes. The problem met by the present invention is created by the degree of conductivity of the liquid mixture becoming so great that the connection between the line supply and the transformer must be broken to allow things to cool off. Disconnection by opening the electronic switch is not a formidable problem. What is serious is the result which flows from badly planned reconnection of the line supply to the transformer. Brief, but large, electrical transients result, creating havoc with the transformer and its components.

Enter the present invention! The system is embodied in the circuit as disclosed. Specifically, within the system, controller 40 receives the inputs from voltage sensor 42 and current sensor 41, and together these systems regulate the disconnection and reconnection of the supply to the transformer 10.

FIG. 2 shows the overload current signal received on line 41A and applied to B2 in controller 40. The information that the current drawn from the line supply is in excess of a predetermined value is passed through B2, B3 and B4 and into A9. Within A9 an overload electronic gate transmits its signal to the switch gates within A6 to turn the solid state switch 44 off, resulting in disconnection of the line supply from transformer 10. This disconnection is relatively simple. However, once disconnection has been completed, the fun starts.

Reconnection is initiated after an interval proportional to the magnitude of the overload current signal that caused the disconnection. Solid state switch 44 is, in effect, turned on by passing a chain of pulses through the switch gates in A6 from A5. The pulse generator selected for the service within A5 specifically discharges a "burst" of pulses for each of its input pulses. The generator functions to supply each burst of pulses to the switch gates over the complete half cycle of supply voltage during which half of the solid state switch operates. The generator selected spits out each burst of half cycle pulses, with the first pulse being of a full width. This form of signal from the pulse generator will insure smooth operation of the solid state switch on each half cycle, giving extended life to the switch.

To energize the generator of A5, a signal enters controller 40 on lines 42A. This signal, a sample of the wave form of the voltage of the supply, is processed to give it a form suitable to actuate the generator of A5, control the switch gates of A6, and the logic circuits of A9. More importantly, the processed signals of line 42A are judiciously delayed, relative to the zero crossings of the supply voltage, to turn on solid state switch 44 at just the right time to compensate for residual flux left in the core of transformer 10 following the preceding disconnection.

An important station location in the circuits is the output of the circuit of A3. The output of A3, as reference circuit signals, is properly delayed relative to the zero crossings of the supply voltage and directed down three general paths. The first path, as just disclosed, ends at the pulse generator in A5 to produce the chain of pulses into the switch gates. The second path leads the reference signals directly into the switch gates to insure that the chain of pulses from the generator will be applied alternately to the two sides of the switch to keep the switch conductive. It could be said that the reference signals are synchronizing generator pulses to the switches in accordance with the duration of the half cycles of the delayed supply voltage. The third path is through the on/off logic circuit A9. Specifically, the reference signals are applied to two cross-connected on/off logic circuits which also respond to the overload signal of the current detector. The result, in A9, is that reconnection takes place on that half cycle of the delayed voltage which is opposite the polarity of the half cycle on which disconnection previously took place. In this way, a reconnection calls for flux generation in transformer 10 of a polarity to balance residual flux remaining in the core from the preceding disconnection.

Should an extreme overload current be developed from the equivalent of a direct shorting across the electrode plates in the load, controller 40 will provide an extra shutdown interval to conserve power. The circuit arrangements in B2 and B3 provide this function as described in the somewhat pedestrian manner with which the disclosure of the details of these circuits was previously made.

After a complete shutdown of the system, start-up procedures will include a delay in the applications of the overload signal to A9 to permit the components of the system to reach their normal state. This delay is provided by the circuits of A10 and is described in the detailed disclosure of that section of controller 40.

There is little question as to the identity of the basic, most important concept of the invention. This concept is embodied in the structure of A2 where the signals representing the phases of the supply voltage are delayed to provide that precise demand for flux by the reconnected supply power in transformer 10 which will balance the residual flux remaining from the last disconnection. Workers in the prior art have been searching steadily for that balance which avoids the creation of destructive transients in the inductive load. Now, the present invention not only provides a first structure with which to set the magnitude of this balancing flux but also a second structure which will provide the flux in the proper polarity.

In combination with at least the broad concept of balancing flux in an inductive load upon reconnection of power, are those concepts of providing a low power profile when disconnection is invoked by extremely high loads, such as a direct short and provision for a delay in the start-up procedure which will enable the components of the system utilized in normal disconnect and reconnect sequences to reach their operative voltage levels before being called upon for service.

From the foregoing, it will be seen that this invention is one well adapted to attain all of the ends and objects hereinabove set forth, together with other advantages which are obvious and inherent to the method and apparatus.

It will be understood that certain features and subcombinations are of utility and may be employed without reference to other features and subcombinations. This is contemplated by and is within the scope of the invention.

As many possible embodiments may be made of the invention without departing from the scope thereof, it is to be understood that all matter herein set forth or shown in the accompanying drawings is to be interpreted in an illustrative and not in a limiting sense.

I claim:

1. A system for disconnecting and reconnecting a.c. power to an inductive load including: a supply of a.c. voltage, a load to be connected to the supply and having components which characterize the load as inductive, a solid state switch between the supply and the load with which the supply is alternately disconnected and reconnected to the load, means for sampling the voltage waveform of the supply and establishing a signal representative of the waveform, a precision comparator connected to the sampling means and detecting the zero crossing of the voltage wave form and generating square waves each of which represents zero wave crossings of the mains voltage, a delay circuit including an adjustable element with which the square waves of the precision comparator are shifted in their relation to the supply zero voltage crossings, two cascaded inverters connected to the delay circuit to receive the delayed square wave output of the delay circuit to establish timing reference output signals at the beginning of the square wave to represent 0° zero crossing reference and at the end of the square wave to represent 180° zero crossing reference, a differentiating and summing circuit connected to the cascaded inverters to receive the timing reference signals and generate square waves of relatively short duration which represent each delayed zero voltage crossing, a pulse generator connected to the differentiating and summing circuit to receive the square waves of relatively short duration each square wave initiating an output chain of pulses from the generator, two gates connected to simultaneously receive the outputs of the pulse generator and the cascaded inverters, and an on/off logic circuit connected to the output of the cascaded inverters and establishing an output signal connected to the two gates, whereby the solid state switch is connected to receive the output of the gates and reconnect the load at that predetermined delay from the zero crossing of the supply voltage as determined by the delay circuit and at that polarity as determined by the on/off logic circuit which will balance the residual flux remaining after the preceding disconnection.

2. The system of claim 1 wherein the pulse generator output of pulse chains initiates each pulse chain with a full width pulse.

3. The system of claim 1 in which the on/off logic circuit includes an overload gate connected to a detector of the current from the supply to the load to establish an output signal which will inhibit the two switch gates from passing the generator pulses for each interval the supply current exceeds a predetermined value.

4. The system of claim 1 in which the output from the on/off logic circuit originates with a detector of the current flowing from the supply to the load whereby the predetermined value of the current generates the output signal of the on/off logic circuit controlling the gates.

5. A system for reconnecting a supply of a.c. power to an inductive load including: an electronic switch in the connection between the supply and the load, and a circuit generating signals to control the electronic switch in turning off the switch and turning on the switch to disconnect and reconnect the supply and the load including: a first circuit section connected to the supply to respond to the wave form of the supply voltage and generating square waves representative of the zero crossing of the voltage waveforms, a delay circuit connected to the first circuit section to receive the square waves and including an adjustable element with which to shift the time of occurrence of the square wave output of the first circuit section in relation to the zero crossings of the supply voltage, a second circuit section connected to the delay circuit to receive the shifted square wave signal and generating an output of timing reference signals at the beginning of the shifted square wave to represent 0° zero crossing reference and at the end of the shifted square wave to represent 180° zero crossing reference, a pulse generator connected to the second circuit section to receive the timing reference signals which initiate a series of pulse chains from the pulse generator with each pulse chain beginning with a full width pulse, electronic gates connected between the pulse generator and the electronic switch and the second circuit section to enable the pulse chains to pass through the gates and turn the switch on as synchronized by the timing reference signal output of the second circuit section, and two cross-connected logic circuits connected between the second circuit section and the gates to receive signals of the second circuit section to insure that the electronic switch receives the pulse chains to reconnect the supply and load in that phase of the supply voltage which will balance the residual flux remaining in the load following the previous disconnection.

6. The system of claim 5 including: means connected to the supply to respond to the current flowing between the supply and the load, and an overload gate circuit connected to the means responding to the current flowing between the supply and the load in order to establish an output signal which will control the gates to establish the time during which the current of the supply exceeds a predetermined maximum to inhibit the gates from passing the pulses from the generator to the switch.

7. The system of claim 6 in which the means connected to the supply is a current transformer as connected to the overload gate circuit the connection between the transformer and the gate including: a precision rectifier circuit connected to the current transformer and having an adjustable element to establish the maximum normal value for the current from the supply to the load and a diode which conducts that current in excess of the maximum value established by the adjustable element, an integrator circuit connected to the diode of the precision rectifier circuit and producing an overload signal with a duration proportional to the magnitude of the overload current from the diode, a comparator circuit connected to the integrator circuit and receiving the overload signal and thereby switching its normal logic high to a logic low for the duration of its overload signal from the integrator, and an overload buss connected between the comparator circuit and the overload gate whereby the overload bus normally has a logic high which is switched to a logic low because of its connection to the comparator circuit, whereby a current value greater than the maximum normal value established by the adjustable element in the precision rectifier becomes an overload signal which is integrated into a signal having a duration proportional to the magnitude of the overload current which will cause the normal logic high of the overload buss to switch to a logic low controlling the overload gate to inhibit passage of the generator output pulses to the solid state switch to turn the switch off.

8. A method of controlling the disconnection and reconnection of an electrical a.c. power supply to an inductive load through a solid state switch connected between the supply and load including: sampling the voltage waveform of the supply and establishing a signal representative of the waveform, detecting the zero crossing of the voltage wave form and generating square waves each of which represents zero wave crossings of the mains voltage, shifting the square waves into their relation to the supply zero voltage crossings, establishing timing reference signals at the beginning of each square wave to represent 0° zero crossing reference and at the end of the square wave to represent 180° zero crossing reference utilizing the timing reference signals to generate square waves of relatively short duration which represent each delayed zero voltage crossing, generating a chain of pulses by the square waves of relatively short duration, and actuating the solid state switch by the pulse chain in a sequence controlled by the timing reference signals to disconnect and reconnect the supply to the load, whereby the solid state switch is reconnected at that predetermined delay from the zero crossing of the supply voltage and at that polarity which will balance the residual flux remaining in the inductive load after the preceding disconnection.

9. The method of claim 8 in which each of the chain of pulses generated by the square waves of relatively short duration is initiated with a full width pulse.

10. The method of claim 8 in which the current from the power supply is detected and applied to inhibit the application of the chain of pulses to the solid state switch for that period of time the current from the supply exceeds a predetermined value.

* * * * *